US012613144B2

(12) United States Patent
Parupalli et al.

(10) Patent No.: US 12,613,144 B2
(45) Date of Patent: Apr. 28, 2026

(54) TEMPERATURE MEASUREMENT USING A THERMISTOR

(71) Applicant: Cirrus Logic International Semiconductor Ltd., Edinburgh (GB)

(72) Inventors: Vamsikrishna Parupalli, Austin, TX (US); Zhong You, Austin, TX (US); Johann G. Gaboriau, Austin, TX (US); Amar Vellanki, Cedar Park, TX (US); Vikrant Arumugam, Cedar Park, TX (US)

(73) Assignee: Cirrus Logic Inc., Austin, TX (US)

( * ) Notice: Subject to any disclaimer, the term of this patent is extended or adjusted under 35 U.S.C. 154(b) by 463 days.

(21) Appl. No.: 18/191,733

(22) Filed: Mar. 28, 2023

(65) Prior Publication Data

US 2023/0366747 A1     Nov. 16, 2023

Related U.S. Application Data

(60) Provisional application No. 63/392,983, filed on Jul. 28, 2022, provisional application No. 63/340,720, filed on May 11, 2022.

(51) Int. Cl.
*G01K 7/22* (2006.01)
*H03M 1/10* (2006.01)

(52) U.S. Cl.
CPC ............ *G01K 7/22* (2013.01); *H03M 1/1014* (2013.01); *G01K 2219/00* (2013.01)

(58) Field of Classification Search
None
See application file for complete search history.

(56) References Cited

U.S. PATENT DOCUMENTS

| | | | | | |
|---|---|---|---|---|---|
| 4,977,366 A | * | 12/1990 | Powell | ................... | G01R 21/02 |
| | | | | | 324/95 |
| 2017/0170839 A1 | * | 6/2017 | Zhao | ................... | H03M 1/1038 |
| 2021/0033654 A1 | * | 2/2021 | Peterson | ................ | G01R 27/02 |

* cited by examiner

*Primary Examiner* — Erica S Lin
(74) *Attorney, Agent, or Firm* — Jackson Walker L.L.P.

(57) ABSTRACT

A current digital-to-analog converter may be used in a system for measuring temperature of a thermistor, with mismatch reduction techniques applied to digital-to-analog converter elements of the digital-to-analog converter in order to maximize accuracy and precisions of the temperature measurement.

18 Claims, 3 Drawing Sheets

TEMPERATURE MEASUREMENT USING A THERMISTOR

RELATED APPLICATIONS

The present disclosure claims priority to U.S. Provisional Patent Application Ser. No. 63/340,720 filed May 11, 2022 and U.S. Provisional Patent Application Ser. No. 63/392,983 filed Jul. 28, 2022, both of which are incorporated by reference herein in their entireties.

FIELD OF DISCLOSURE

The present disclosure relates in general to circuits for electronic devices, including without limitation personal audio devices such as wireless telephones and media players, and more specifically, systems and methods for temperature measurement using a thermistor.

BACKGROUND

In an electrical or electronic system, it is desirable to measure a temperature within such system. A type of temperature sensor often employed in electrical and electronic systems is a negative temperature coefficient (NTC) thermistor, which has an electrical impedance R that varies exponentially with variance in temperature in accordance with the equation:

$$R = R_0 e^{\beta\left(\frac{1}{T} - \frac{1}{T_0}\right)}$$

where $R_0$ is the impedance at a temperature $T_0$, T is the temperature of the thermistor, and $\beta$ is a temperature constant of the thermistor. Accordingly, by measuring the thermistor's impedance, a temperature of or proximate to the thermistor may be derived. However, due to the exponential dependence of the impedance on temperature, it may be difficult to achieve resolution of a temperature measurement at higher temperatures.

A number of approaches may be used to measure impedance of a thermistor. For example, the thermistor impedance may be measured by measuring a voltage ratio between a known reference resistor and the thermistor, as well as measuring the voltage driven to both. As another example, the thermistor impedance may be measured by measuring a voltage across the thermistor by driving a current into the thermistor and driving the same current across a known reference resistor and solving for the thermistor impedance value. Under both these example approaches, solving for the impedance may be independent of an analog-to-digital converter (ADC) reference voltage or a drive voltage for the current.

It may be preferable to maintain drive voltage or drive current constant across the measurement of thermistor current and reference resistance, so as to not introduce errors between measurements.

For an ADC to measure and convert analog measurements into digital equivalent signals with a resolution of 0.01° C. across a wide temperature range (e.g., a range of 105° C., from −20° C. to 85° C.), the number of bits required is approximately 13.3 bits. In order to have the same 0.01° C. resolution with an NTC thermistor with an $R_0$ of 10 KΩ at $T_0$ of 25° C. and a temperature constant $\beta$ of 3380° C., the resolution of the ADC may need to be approximately 17.6 bits. Thus, systems and methods for accurately and precisely measuring temperature with a thermistor and a lower resolution ADC may be desired.

SUMMARY

In accordance with the teachings of the present disclosure, one or more disadvantages and problems associated with existing approaches to measuring temperature with a thermistor may be reduced or eliminated.

In accordance with embodiments of the present disclosure, a system may include a digital-to-analog converter (DAC) comprising a plurality of DAC elements, an analog-to-digital converter (ADC) path, a thermistor coupled between an output of the DAC and an input of the ADC path, a reference impedance coupled in parallel with the thermistor between the output of the DAC and the input of the ADC path, and a digital controller coupled between an output of the ADC path and an input of the DAC. The digital controller may be configured to cause the DAC to drive a test current into the thermistor, measure a test voltage across the thermistor responsive to the test current via the ADC path, determine a first current for maximizing an input signal to the ADC based on the test voltage, enable a first number of the DAC elements of the DAC in order to generate the first current and drive the first current into the thermistor, measure a first voltage across the thermistor responsive to the first current via the ADC path, while measuring the first voltage, cause the plurality of DAC elements to be equally engaged via a mismatch reduction technique, determine a second current based on an impedance of the reference impedance, enable a second number of the DAC elements of the DAC in order to generate the second current and drive the second current into the reference impedance, measure a second voltage across the reference impedance responsive to the second current via the ADC path, while measuring the second voltage, cause the plurality of DAC elements to be equally engaged via the mismatch reduction technique, and determine an impedance of the thermistor based on the first voltage and the second voltage.

In accordance with these and other embodiments of the present disclosure, a system may include a digital-to-analog converter (DAC) comprising a plurality of DAC elements, an analog-to-digital converter (ADC) path, a thermistor coupled between an output of the DAC and an input of the ADC path, a reference impedance coupled in parallel with the thermistor between the output of the DAC and the input of the ADC path, and a digital controller coupled between an output of the ADC path and an input of the DAC. The digital controller may be configured to enable a first number of the plurality of DAC elements to generate a reference current to the reference impedance, enable a second number of the plurality of DAC elements to generate a test current to the thermistor, measure a voltage difference between a test voltage across the thermistor responsive to the test current and a reference voltage across the reference impedance responsive to the reference current, determine a first value of the first number and a second value of the second number at which a magnitude of a voltage measured by the ADC path is minimized, while measuring the voltage, cause the plurality of DAC elements to be equally engaged via a mismatch reduction technique; determine a current for minimizing an input signal to the ADC based on the voltage, and determine an impedance of the thermistor based on the current for minimizing the input signal to the ADC, the first value, and the second value.

In accordance with these and other embodiments of the present disclosure, a method may be used in a system having a digital-to-analog converter (DAC) comprising a plurality of DAC elements, an analog-to-digital converter (ADC) path, a thermistor coupled between an output of the DAC and an input of the ADC path, and a reference impedance coupled in parallel with the thermistor between the output of the DAC and the input of the ADC path. The method may include controlling the system with a digital controller coupled between an output of the ADC path and an input of the DAC and configured to cause the DAC to drive a test current into the thermistor, measure a test voltage across the thermistor responsive to the test current via the ADC path, determine a first current for maximizing an input signal to the ADC based on the test voltage, enable a first number of the DAC elements of the DAC in order to generate the first current and drive the first current into the thermistor, measure a first voltage across the thermistor responsive to the first current via the ADC path, while measuring the first voltage, cause the plurality of DAC elements to be equally engaged via a mismatch reduction technique, determine a second current based on an impedance of the reference impedance, enable a second number of the DAC elements of the DAC in order to generate the second current and drive the second current into the reference impedance, measure a second voltage across the reference impedance responsive to the second current via the ADC path, while measuring the second voltage, cause the plurality of DAC elements to be equally engaged via the mismatch reduction technique; and determine an impedance of the thermistor based on the first voltage and the second voltage.

In accordance with these and other embodiments of the present disclosure, a method may be used in a system having a digital-to-analog converter (DAC) comprising a plurality of DAC elements, an analog-to-digital converter (ADC) path, a thermistor coupled between an output of the DAC and an input of the ADC path, and a reference impedance coupled in parallel with the thermistor between the output of the DAC and the input of the ADC path. The method may include controlling the system with a digital controller coupled between an output of the ADC path and an input of the DAC and configured to enable a first number of the plurality of DAC elements to generate a reference current to the reference impedance, enable a second number of the plurality of DAC elements to generate a test current to the thermistor, measure a voltage difference between a test voltage across the thermistor responsive to the test current and a reference voltage across the reference impedance responsive to the reference current, determine a first value of the first number and a second value of the second number at which a magnitude of a voltage measured by the ADC path is minimized, while measuring the voltage, cause the plurality of DAC elements to be equally engaged via a mismatch reduction technique, determine a current for minimizing an input signal to the ADC based on the voltage, and determine an impedance of the thermistor based on the voltage measured by the ADC path responsive to the current for minimizing the input signal to the ADC, the first value, and the second value.

Technical advantages of the present disclosure may be readily apparent to one skilled in the art from the figures, description, and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
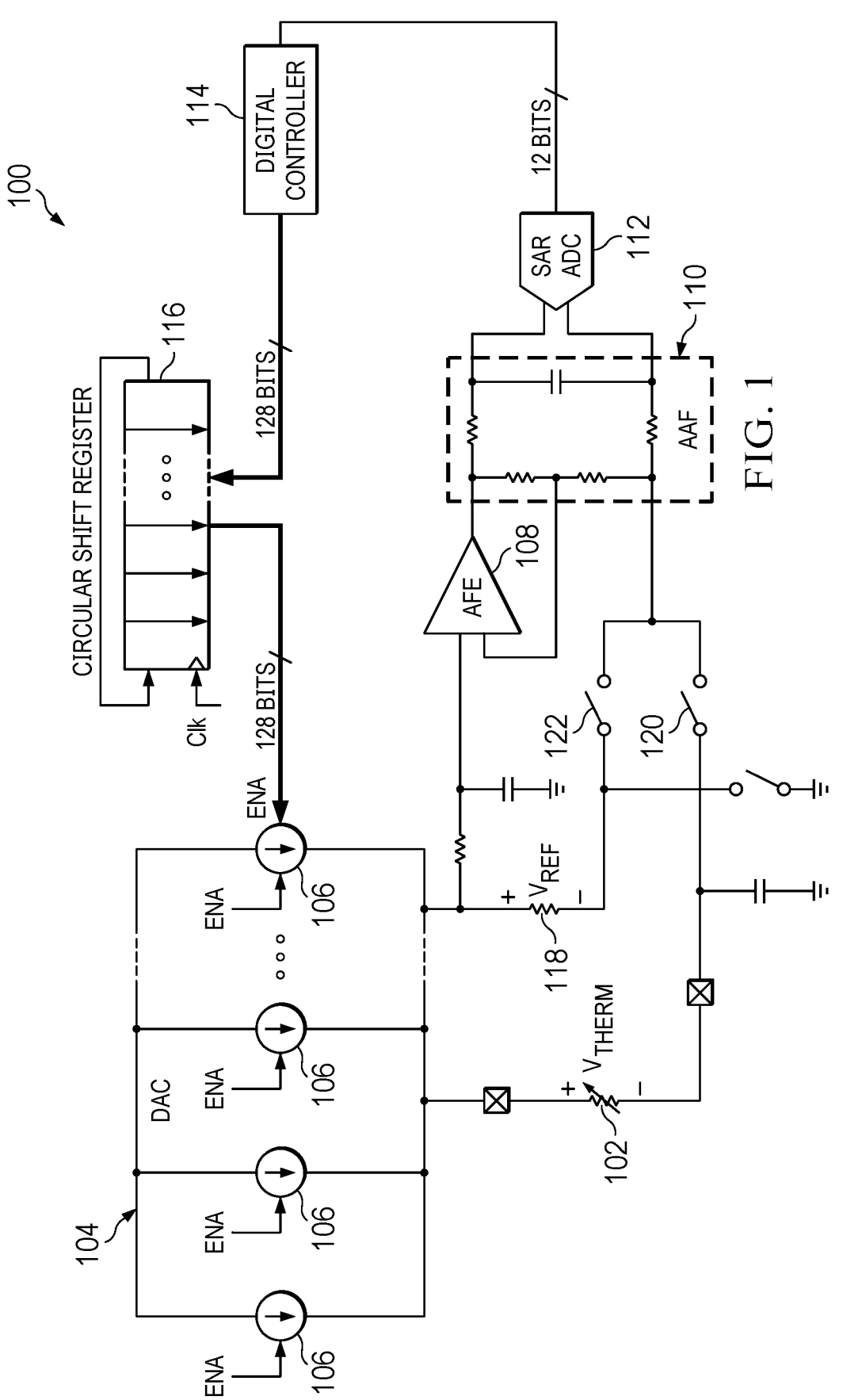
FIG. 1 illustrates selected components of an example system for measuring a temperature using a thermistor, in accordance with embodiments of the present disclosure.

FIG. 1 illustrates selected components of an example system 100 for measuring a temperature using a thermistor 102, in accordance with embodiments of the present disclosure.

Thermistor 102 may comprise any suitable system, device, or apparatus having an impedance R which is a function of a temperature of or proximate to the thermistor. In some embodiments, thermistor 102 may comprise an NTC thermistor, such as that described in the Background section above.

As shown in FIG. 1, system 100 may include a digital-to-analog converter (DAC) 104 having a plurality of DAC elements 106. DAC 104 may be implemented as a weighted current DAC in the embodiments represented by FIG. 1, and may be configured to generate bias currents for thermistor 102 and reference impedance 118, as described in greater detail below.

System 100 may also include an ADC path comprising an analog front end (AFE) 108 implementing a fixed-gain (e.g., a multiplicative gain of 7) non-inverting amplifier, anti-aliasing filter (AAF) 110, and ADC 112. ADC 112 may be implemented as a successive-approximation register (SAR) ADC in the embodiments represented by FIG. 1. Although ADC 112 is depicted in FIG. 1 as having an output resolution of 12 bits, ADC 112 may have any suitable output resolution.

System 100 may further include a digital controller 114 coupled to the output ADC 112 and configured to control a circular shift register 116 and DAC 104 based on the output of ADC 112, as described in more detail below. Digital controller 114 may comprise a processor, digital signal processor, application-specific integrated circuit, and/or other processing circuit. In some embodiments, all or part of the functionality of digital controller 114 may be implemented using firmware and/or software. Although digital controller 114, circular shift register 116, and DAC 104 are depicted in FIG. 1 as having resolutions of 128 bits, these components may have any suitable resolution.

In addition, a reference impedance 118 having a known impedance $R_{REF}$ may be in parallel with thermistor 102 and coupled, along with thermistor 102, between DAC 104 and the ADC path.

Figure 2:
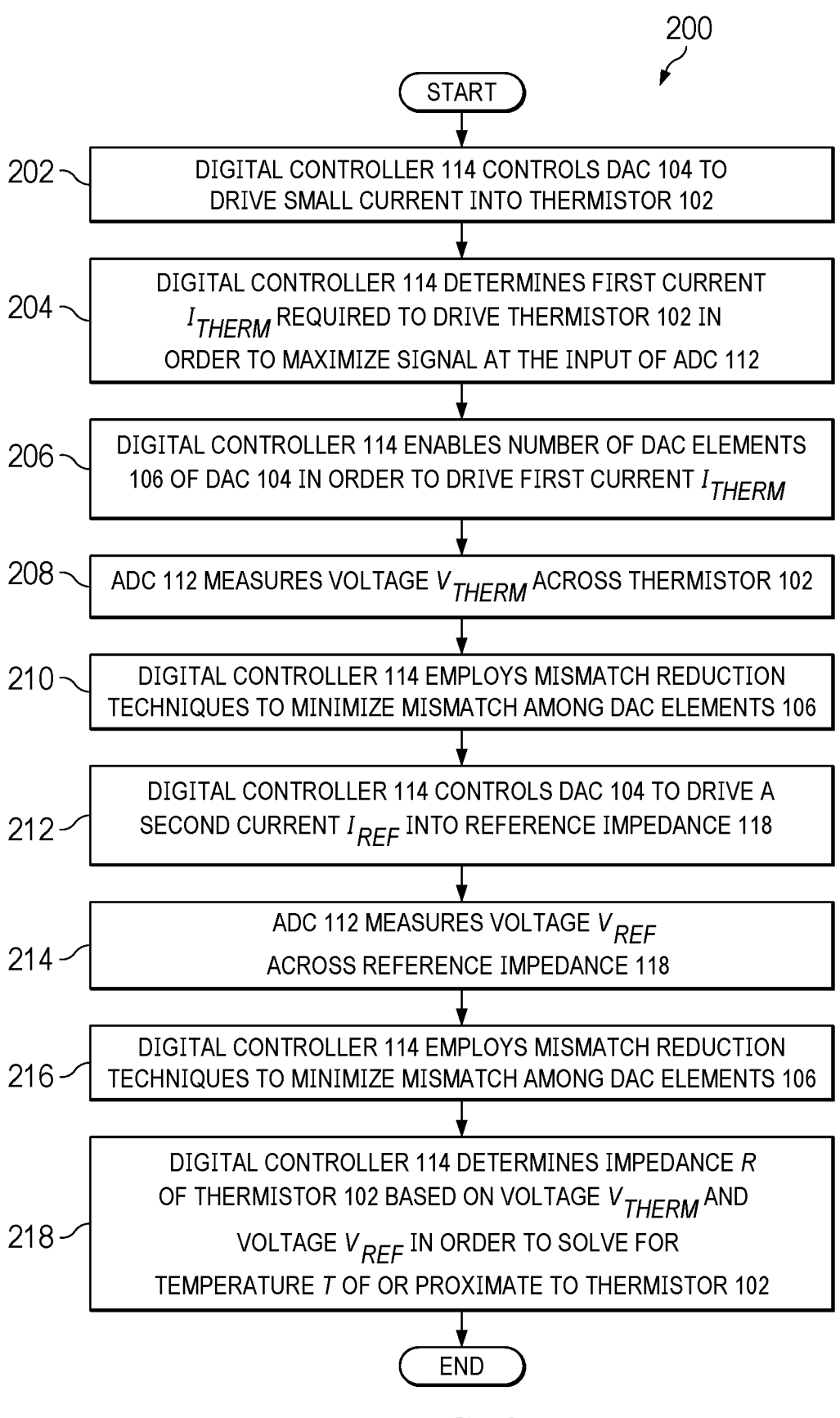
FIG. 2 illustrates a flow chart of an example method for measuring a temperature using a thermistor, in accordance with embodiments of the present disclosure.

FIG. 2 illustrates a flow chart of an example method 200 for measuring a temperature using thermistor 102, in accordance with embodiments of the present disclosure. According to certain embodiments, method 200 may begin at step 202. As noted above, teachings of the present disclosure may be implemented in a variety of configurations of system 100 as shown in FIG. 1. As such, the preferred initialization point for method 200 and the order of the steps comprising method 200 may depend on the implementation chosen. In these and other embodiments, method 200 may be implemented using hardware, firmware, software, applications, functions, libraries, or a combination thereof.

At step 202, digital controller 114 may control DAC 104 to drive a small test current into thermistor 102, and the ADC path including ADC 112 may measure a test voltage across thermistor 102 and convert such measurement into a digital equivalent signal. At step 204, digital controller 114 may analyze the voltage to determine a first current $I_{THERM}$ required to drive thermistor 102 in order to maximize a signal at the input of ADC 112. For example, in some embodiments, first current $I_{THERM}$ may be selected as the current needed to generate a voltage at the input of ADC 112 which is approximately at the full-scale resolution (e.g., approximately 90% of full-scale resolution or more) of ADC 112. At step 206, digital controller 114 may enable a number of DAC elements 106 of DAC 104 in order to drive first current $I_{THERM}$.

After DAC elements 106 are enabled to drive first current $I_{THERM}$, at step 208, ADC 112 may measure a voltage $V_{THERM}$ across thermistor 102. In some embodiments, digital controller 114 and ADC 112 may be configured to collect several samples of voltage $V_{THERM}$ and average the samples to filter out noise in system 100. At step 210, while ADC 112 measures voltage $V_{THERM}$ across thermistor 102, digital controller 114 may employ mismatch reduction techniques to minimize mismatch among DAC elements 106. For example, as shown in FIG. 1, digital controller 114 may control circular shift register 116 to apply a circular shift of DAC elements 106 in order to minimize mismatch. As a specific example, DAC elements 106 may be shifted at a rate of 4 MHz, which may ensure that within a 32-μs sampling period, all 128 DAC elements 106 may be engaged.

During steps 202 through 210, digital controller 114 or another component of system 100 may cause switch 120 to close and switch 122 to open.

At step 212, digital controller 114 may control DAC 104 to drive a second current $I_{REF}$ into reference impedance 118. The magnitude of second current $I_{REF}$, and thus the number of DAC elements 106 enabled to drive second current $I_{REF}$, may be based on impedance $R_{REF}$ of reference impedance 118. For example, in some embodiments, second current $I_{REF}$ may be selected as an estimated current needed to generate a voltage at the input of ADC 112 which is approximately at the full-scale resolution (e.g., approximately 90% of full-scale resolution or more) of ADC 112. At step 214, ADC 112 may measure a voltage $V_{REF}$ across reference impedance 118. In some embodiments, digital controller 114 and ADC 112 may be configured to collect several samples of voltage $V_{THERM}$ and average the samples to filter out noise in system 100. At step 216, while ADC 112 measures voltage $V_{REF}$ across reference impedance 118, digital controller 114 may employ mismatch reduction techniques to minimize mismatch among DAC elements 106. As a specific example, DAC elements 106 may be shifted at a rate of 4 MHz, which may ensure that within a 32-μs sampling period, all 128 DAC elements 106 may be engaged.

During steps 212 through 216, digital controller 114 or another component of system 100 may cause switch 122 to close and switch 120 to open.

At step 218, digital controller 114 may determine impedance R of thermistor 102 based on voltage $V_{THERM}$ and voltage $V_{REF}$, and may also solve for temperature T of or proximate to thermistor 102 based on determined impedance R. For example, impedance R may be calculated by:

$$R = R_{REF} \frac{V_{THERM}}{V_{REF}} \frac{I_{REF}}{I_{THERM}}$$

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using system 100, components thereof, or any other system such as that shown in FIG. 1 operable to implement method 200. In certain embodiments, method 200 may be implemented partially or fully in software and/or firmware embodied in computer-readable media.

Because voltages measured for wide ranges of temperature are biased to about 90% of full scale ADC resolution or more, the integral nonlinearity error of ADC 112 may not contribute to significant error in the measurement of impedance and temperature. However, scaling DAC 104 based on initial estimation of load impedance can introduce new errors, because the current drive may not be the same across measurements of voltage $V_{THERM}$ and voltage $V_{REF}$. Due to mismatch of DAC elements 106, current $I_{THERM}$ and current $I_{REF}$ may not be perfectly scaled.

System 100 may solve this mismatch issue, as all DAC elements 106 may be equally engaged during a voltage measurement phase of voltage $V_{THERM}$ and voltage $V_{REF}$ (e.g., by circular shifting of DAC elements 106 using circular shift register 116).

Figure 3:
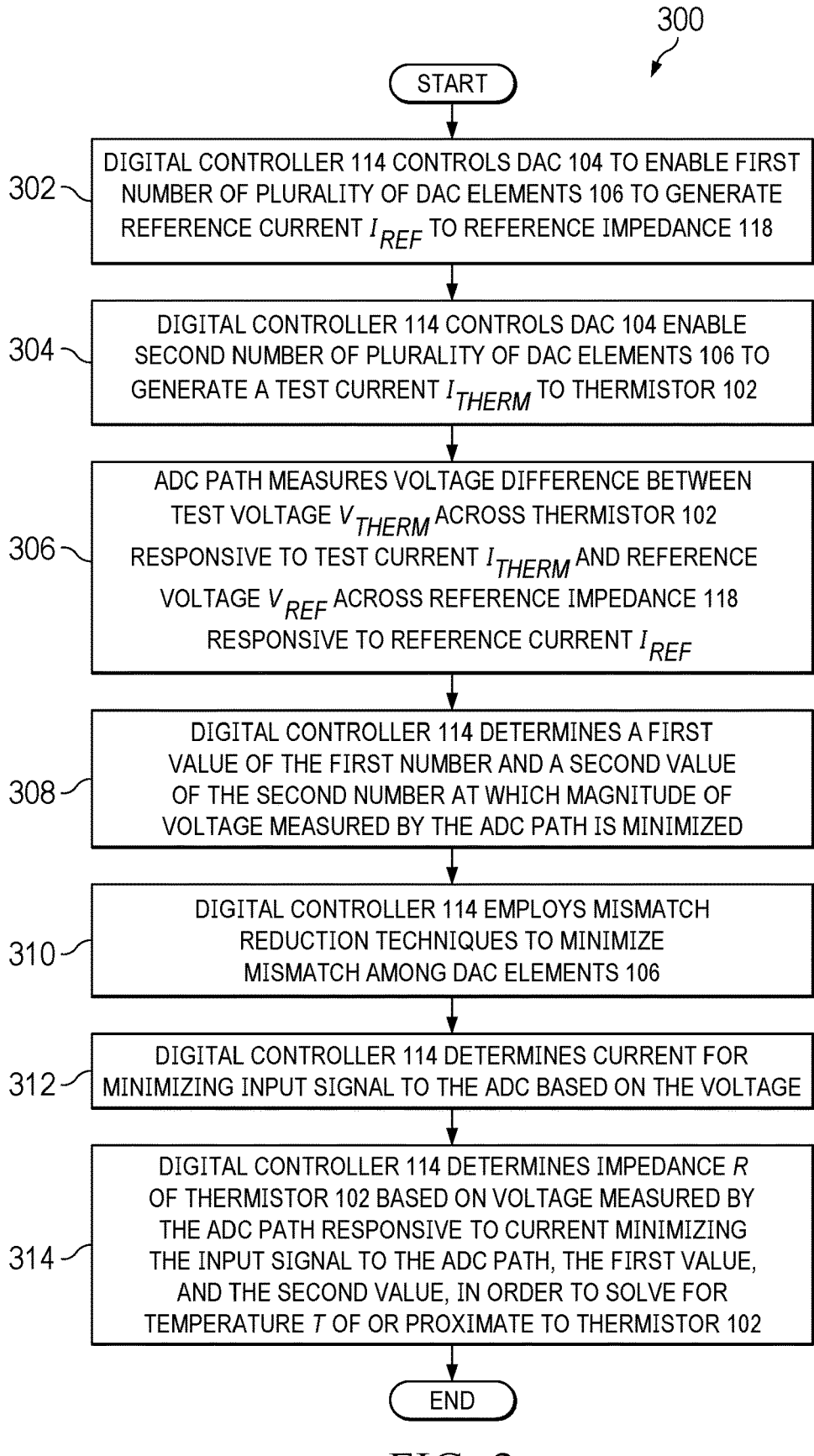
FIG. 3 illustrates a flow chart of another example method for measuring a temperature using a thermistor, in accordance with embodiments of the present disclosure.

FIG. 3 illustrates a flow chart of an example method 300 for measuring a temperature using thermistor 102, in accordance with embodiments of the present disclosure. According to certain embodiments, method 300 may begin at step 302. As noted above, teachings of the present disclosure may be implemented in a variety of configurations of system 100 as shown in FIG. 1. As such, the preferred initialization point for method 300 and the order of the steps comprising method 300 may depend on the implementation chosen. In these and other embodiments, method 300 may be implemented using hardware, firmware, software, applications, functions, libraries, or a combination thereof.

At step 302, digital controller 114 may control DAC 104 to enable a first number of the plurality of DAC elements 106 to generate a reference current $I_{REF}$ to reference impedance 118. At step 304, digital controller 114 may control DAC 104 to enable a second number of the plurality of DAC elements 106 (which may be all of the plurality of DAC elements other than the first number of DAC elements) to generate a test current $I_{THERM}$ to thermistor 102. At step 306, the ADC path may measure a voltage difference between a test voltage $V_{THERM}$ across thermistor 102 responsive to test current $I_{THERM}$ and a reference voltage $V_{REF}$ across reference impedance 118 responsive to reference current $I_{REF}$.

At step 308, digital controller 114 may determine a first value of the first number and a second value of the second number at which a magnitude of a voltage measured by the ADC path is minimized. At step 310, while ADC 112 measures the voltage at the input of the ADC path, digital controller 114 may employ mismatch reduction techniques to minimize mismatch among DAC elements 106. For example, as shown in FIG. 1, digital controller 114 may control circular shift register 116 to apply a circular shift of DAC elements 106 in order to minimize mismatch.

At step 312, digital controller 114 may determine a current for minimizing an input signal to the ADC based on the voltage. At step 314, digital controller 114 may determine impedance R of thermistor 102 based on the voltage measured by the ADC path responsive to the current for minimizing the input signal to the ADC, the first value, and the second value, and may also solve for temperature T of or proximate to thermistor 102 based on determined impedance R.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using system 100, components thereof, or any other system such as that shown in FIG. 1 operable to implement method 300. In certain embodiments, method 300 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in FIG. 1s and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a digital-to-analog converter (DAC) comprising a plurality of DAC elements;
   an analog-to-digital converter (ADC) path;
   a thermistor coupled between an output of the DAC and an input of the ADC path;
   a reference impedance coupled in parallel with the thermistor between the output of the DAC and the input of the ADC path; and
   a digital controller coupled between an output of the ADC path and an input of the DAC and configured to:
   cause the DAC to drive a test current into the thermistor;
   measure a test voltage across the thermistor responsive to the test current via the ADC path;
   determine a first current for maximizing an input signal to the ADC based on the test voltage;
   enable a first number of the DAC elements of the DAC in order to generate the first current and drive the first current into the thermistor;
   measure a first voltage across the thermistor responsive to the first current via the ADC path;
   while measuring the first voltage, cause the plurality of DAC elements to be equally engaged via a mismatch reduction technique;
   determine a second current based on an impedance of the reference impedance;
   enable a second number of the DAC elements of the DAC in order to generate the second current and drive the second current into the reference impedance;
   measure a second voltage across the reference impedance responsive to the second current via the ADC path;
   while measuring the second voltage, cause the plurality of DAC elements to be equally engaged via the mismatch reduction technique; and
   determine an impedance of the thermistor based on the first voltage and the second voltage.

2. The system of claim 1, wherein the mismatch reduction technique comprises a circular shifting of DAC elements.

3. The system of claim 1, wherein the DAC is a current DAC.

4. The system of claim 1, wherein determining the first current comprises determining the first current such that the first voltage is approximately the maximum full scale value of the ADC path.

5. The system of claim 4, wherein determining the first current comprises determining the first current such that the first voltage is approximately 90% of the maximum full scale value of the ADC path.

6. The system of claim 1, wherein determining the second current comprises determining the second current such that the second voltage is approximately the maximum full scale value of the ADC path.

7. The system of claim 6, wherein determining the second current comprises determining the second current such that the second voltage is approximately 90% or more of the maximum full scale value of the ADC path.

8. The system of claim 1, wherein the digital controller is further configured to determine the impedance of the thermistor as equal to an impedance of the reference impedance multiplied by a first ratio of the first voltage to the second voltage further multiplied by a second ratio of the second current to the first current.

9. The system of claim 1, wherein the digital controller is further configured to determine a temperature associated with the thermistor based on the impedance of the thermistor.

10. A method comprising, in a system having a digital-to-analog converter (DAC) comprising a plurality of DAC elements, an analog-to-digital converter (ADC) path, a thermistor coupled between an output of the DAC and an input of the ADC path, and a reference impedance coupled in parallel with the thermistor between the output of the DAC and the input of the ADC path:

controlling the system with a digital controller coupled between an output of the ADC path and an input of the DAC and configured to:

cause the DAC to drive a test current into the thermistor;

measure a test voltage across the thermistor responsive to the test current via the ADC path;

determine a first current for maximizing an input signal to the ADC based on the test voltage;

enable a first number of the DAC elements of the DAC in order to generate the first current and drive the first current into the thermistor;

measure a first voltage across the thermistor responsive to the first current via the ADC path;

while measuring the first voltage, cause the plurality of DAC elements to be equally engaged via a mismatch reduction technique;

determine a second current based on an impedance of the reference impedance;

enable a second number of the DAC elements of the DAC in order to generate the second current and drive the second current into the reference impedance;

measure a second voltage across the reference impedance responsive to the second current via the ADC path;

while measuring the second voltage, cause the plurality of DAC elements to be equally engaged via the mismatch reduction technique; and determine an impedance of the thermistor based on the first voltage and the second voltage.

11. The method of claim 10, wherein the mismatch reduction technique comprises a circular shifting of DAC elements.

12. The method of claim 10, wherein the DAC is a current DAC.

13. The method of claim 10, wherein determining the first current comprises determining the first current such that the first voltage is approximately the maximum full scale value of the ADC path.

14. The method of claim 13, wherein determining the first current comprises determining the first current such that the first voltage is approximately 90% of the maximum full scale value of the ADC path.

15. The method of claim 10, wherein determining the second current comprises determining the second current such that the second voltage is approximately the maximum full scale value of the ADC path.

16. The method of claim 15, wherein determining the second current comprises determining the second current such that the second voltage is approximately 90% or more of the maximum full scale value of the ADC path.

17. The method of claim 10, wherein the digital controller is further configured to determine the impedance of the thermistor as equal to an impedance of the reference impedance multiplied by a first ratio of the first voltage to the second voltage further multiplied by a second ratio of the second current to the first current.

18. The method of claim 10, wherein the digital controller is further configured to determine a temperature associated with the thermistor based on the impedance of the thermistor.

\* \* \* \* \*